United States Patent
Akioka (10) Patent No.: US 6,646,935 B2
(45) Date of Patent: Nov. 11, 2003

(54) SEMICONDUCTOR MEMORY DEVICE FOR REDUCING NUMBER OF INPUT CYCLES FOR INPUTTING TEST PATTERN

(75) Inventor: Toshiaki Akioka, Kawasaki (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/052,144

(22) Filed: Jan. 17, 2002

(65) Prior Publication Data

US 2002/0093862 A1 Jul. 18, 2002

(30) Foreign Application Priority Data

Jan. 17, 2001 (JP) ........................................ 2001-009376

(51) Int. Cl.[7] ................................................ G11C 7/00
(52) U.S. Cl. .................................. 365/201; 365/230.08
(58) Field of Search ............................ 365/201, 230.01, 365/230.06, 230.08, 189.05, 233, 236

(56) References Cited

U.S. PATENT DOCUMENTS

| | | | | | |
|---|---|---|---|---|---|
| 5,956,289 | A | * | 9/1999 | Norman et al. | 365/185.23 |
| 6,041,013 | A | * | 3/2000 | Kohno | 365/203 |
| 6,256,240 | B1 | * | 7/2001 | Shinozaki | 365/201 |
| 6,272,056 | B1 | * | 8/2001 | Ooishi | 365/200 |
| 6,292,421 | B1 | * | 9/2001 | Shore et al. | 365/201 |
| 6,381,190 | B1 | * | 4/2002 | Shinkai | 365/189.01 |
| 2001/0054164 | A1 | * | 12/2001 | Tanizaki et al. | 714/718 |

FOREIGN PATENT DOCUMENTS

| | | | |
|---|---|---|---|
| JP | 63-184989 | 7/1988 | G11C/11/34 |
| JP | 2-28853 | 1/1990 | G06F/12/14 |
| JP | 9-245498 | 9/1997 | G11C/29/00 |
| JP | 10-162600 | 6/1998 | G11C/29/00 |
| JP | 11-39226 | 2/1999 | G06F/12/16 |

* cited by examiner

Primary Examiner—Thong Le
(74) Attorney, Agent, or Firm—Hayes Soloway P.C.

(57) ABSTRACT

A memory device is provided for reducing the test time and the complexity of the test pattern. The memory device is composed of a memory cell array including a plurality of memory cells, an I/O buffer, a command providing unit, an address providing unit, and an address decoder. The command providing unit is responsive to a test mode signal for providing a command that controls an access to the memory cell array. The address providing unit provides an address in response to the command. The address decoder allows the memory cell array to be accessed in response to the address. The command providing unit sets the command to be a predetermined internal command when the test mode signal is activated. The command providing unit, when the test mode signal is not activated, receives an external command through the I/O buffer and sets the command to be the external command.

15 Claims, 8 Drawing Sheets

SEMICONDUCTOR MEMORY DEVICE FOR REDUCING NUMBER OF INPUT CYCLES FOR INPUTTING TEST PATTERN

BACKGROUND OF THE INVENTION

1. Field of the Invention

The present invention relates to the testing of semiconductor memory devices, and more specifically to a semiconductor memory device and method for reducing a number of input cycles needed to input a test pattern, and thereby shortens the testing time and also simplifies the test pattern.

2. Description of the Related Art

Semiconductor memory devices are tested to ensure that they operate properly. To test memory devices, a test pattern including a command and an address, as well as test data, should be provided therewith. When a serial access memory is tested, the command and the address must be serially inputted over a plurality of input cycles.

Figure 1:
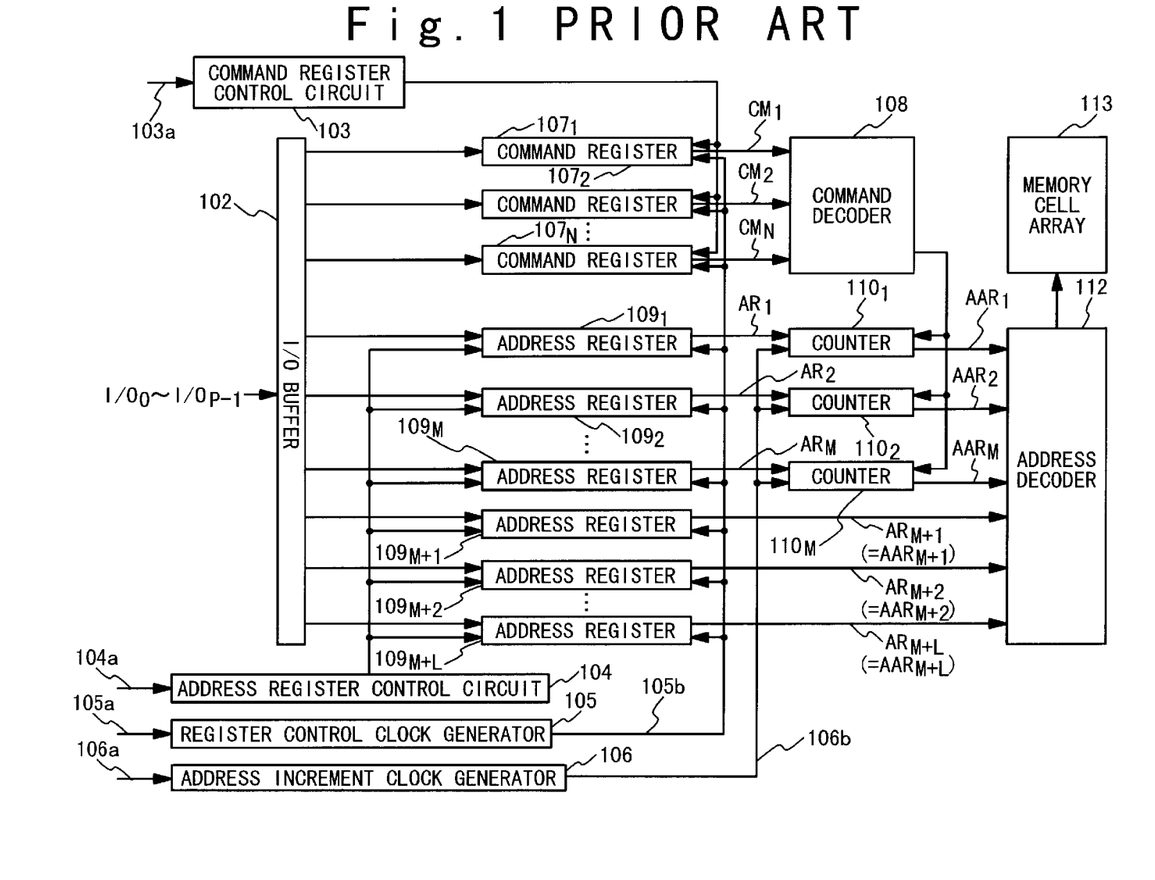
FIG. 1 is a block diagram showing a conventional serial access memory.

FIG. 1 shows a block diagram of a typical conventional serial access memory device. The memory device includes an I/O buffer 102, a command register control circuit 103, an address register control circuit 104, a register control clock generator 105, an address increment clock generator 106, command registers $107_1$–$107_N$, a command decoder 108, address registers $109_1$–$109_{M+L}$, counters $110_1$–$110_M$, an address decoder 112, and a memory cell array 113. The memory cell array 113 includes a plurality of memory cells arranged in rows and columns.

The I/O buffer 102 receives external I/O signals $I/O_0$–$I/O_{P-1}$ developed by an external circuit (not shown). The I/O signals $I/O_0$–$I/O_{P-1}$ sequentially transfer a test pattern including a command and an initial address.

The command is represented by N command values, and the initial address is represented by (M+L) initial address values, where N, M, and L are an integer. The N, M, and L are determined on the basis of the scale of the memory device.

Each of the N command values and the (M+L) initial address values are constituted by P bits, each of which is respectively associated with I/O signals $I/O_0$–$I/O_{P-1}$. Hereinafter, each of the N command values is respectively denoted by command values $CM_1$–$CM_N$, and each of the (M+L) initial address values is respectively denoted by initial address values $AR_1$–$AR_{M+L}$. The command values $CM_1$–$CM_N$ are respectively outputted to the command registers $107_1$–$107_N$, and the initial address values $AR_1$–$AR_{M+L}$ are respectively outputted to the address registers $109_1$–$109_{M+L}$.

The command register control circuit 103 sequentially activates the command register $107_1$–$107_N$ in response to a register control signal 103a provided by an external circuit (not shown). The activation of each of the command register $107_1$–$107_N$ is respectively synchronized with the inputs of the command values $CM_1$–$CM_N$.

The address register control circuit 104 sequentially activates the address registers $109_1$–$109_{M+L}$ in response to a register control signal 104a provided by an external circuit (not shown). The activation of each of the address registers $109_1$–$109_{M+L}$ is respectively synchronized with the inputs of the initial address values $AR_1$–$AR_{M+L}$.

The register control clock generator 105 is responsive to an external clock signal 105a for developing a register control clock signal 105b. The register control clock signal 105b is outputted to the command registers $107_1$–$107_N$ and the address registers $109_1$–$109_{M+L}$.

The address increment clock generator 106 is responsive to another external clock signal 106a for developing an address increment clock signal 106b. The address increment clock signal 106 is outputted to the counters $110_1$–$110_M$.

The command registers $107_1$–$107_N$ are sequentially activated by the command register control signal 103b to respectively latch the command values $CM_1$–$CM_N$. The latching of the command values is executed in synchronization with the register control clock signal 105b. The command registers $107_1$–$107_N$ respectively outputs the latched command values $CM_1$–$CM_N$ to the command decoder 108.

The command decoder 108 decodes the command values $CM_1$–$CM_N$ to generate a command that determines an access mode of an access to the memory cell array 112. The command decoder 108 informs the counter $110_1$–$110_M$ of the generated command.

The address registers $109_1$–$109_{M+L}$ are sequentially activated by the address register control signal 104b to respectively latch the initial address values $AR_1$–$AR_{M+L}$. The latching of the initial address values $AR_1$–$AR_{M+L}$ is executed in synchronization with the register control clock signal 105b. The address registers $109_1$–$109_M$ respectively output the initial address values $AR_1$–$AR_{M+L}$ to the counter $110_1$–$110_M$, while the remaining address registers $109_{M+1}$–$109_{M+L}$ respectively output the initial address values $AR_{M+1}$–$AR_{M+L}$ to the address decoder 112. The initial address values $AR_1$–$AR_M$ is representative of a lower address of the initial address, while the initial address values $AR_{M+1}$–$AR_{M+L}$ are representative of an upper address of the initial address. In a serial access of the memory cell array 113, the upper address of the accessed memory cells is fixed to the initial upper address represented by the initial address values $AR_{M+1}$–$AR_{M+L}$. Therefore, the initial address values $AR_{M+1}$–$AR_{M+L}$ may be denoted by address values $AAR_{M+1}$–$AAR_{M+L}$ which are representative of an upper address of the accessed memory cells in the following.

The counters $110_1$–$110_M$ respectively generate address values $AAR_1$–$AAR_M$ which are representative of a lower address of the memory cell to be accessed in the memory cell array 112. The counters $110_1$–$110_M$ respectively receive the initial address values $AR_1$–$AR_M$ from the address register $109_1$–$109_M$ to initialize the address values $AAR_1$–$AAR_M$ respectively to the initial address values $AR_1$–$AR_M$ before a serial access to the memory cell array 112 is started. During the serial access, the counters $110_1$–$110_M$ respectively increment the address values $AAR_1$–$AAR_M$, and thereby increment the lower address of the accessed memory cell. The counters $110_1$–$110_M$ also controls the address values $AAR_1$–$AAR_M$ in responsive to the command determined by the command decoder 108. The counters $110_1$–$110_M$ output the address values $AAR_1$–$AAR_M$.

The address decoder 112 receives the address values $AAR_1$–$AAR_M$ from the counter $110_1$–$110_M$ and the address values $AAR_{M+1}$–$AAR_{M+L}$ (which are respectively same as the initial address values $AR_{M+1}$–$AR_{M+L}$) from the address registers $109_{M+1}$–$109_{M+L}$. The address decoder 112 decodes the address values $AAR_1$–$AAR_{M+L}$ to allow one of the memory cells in the memory cell array 113 to be accessed.

Figure 2:
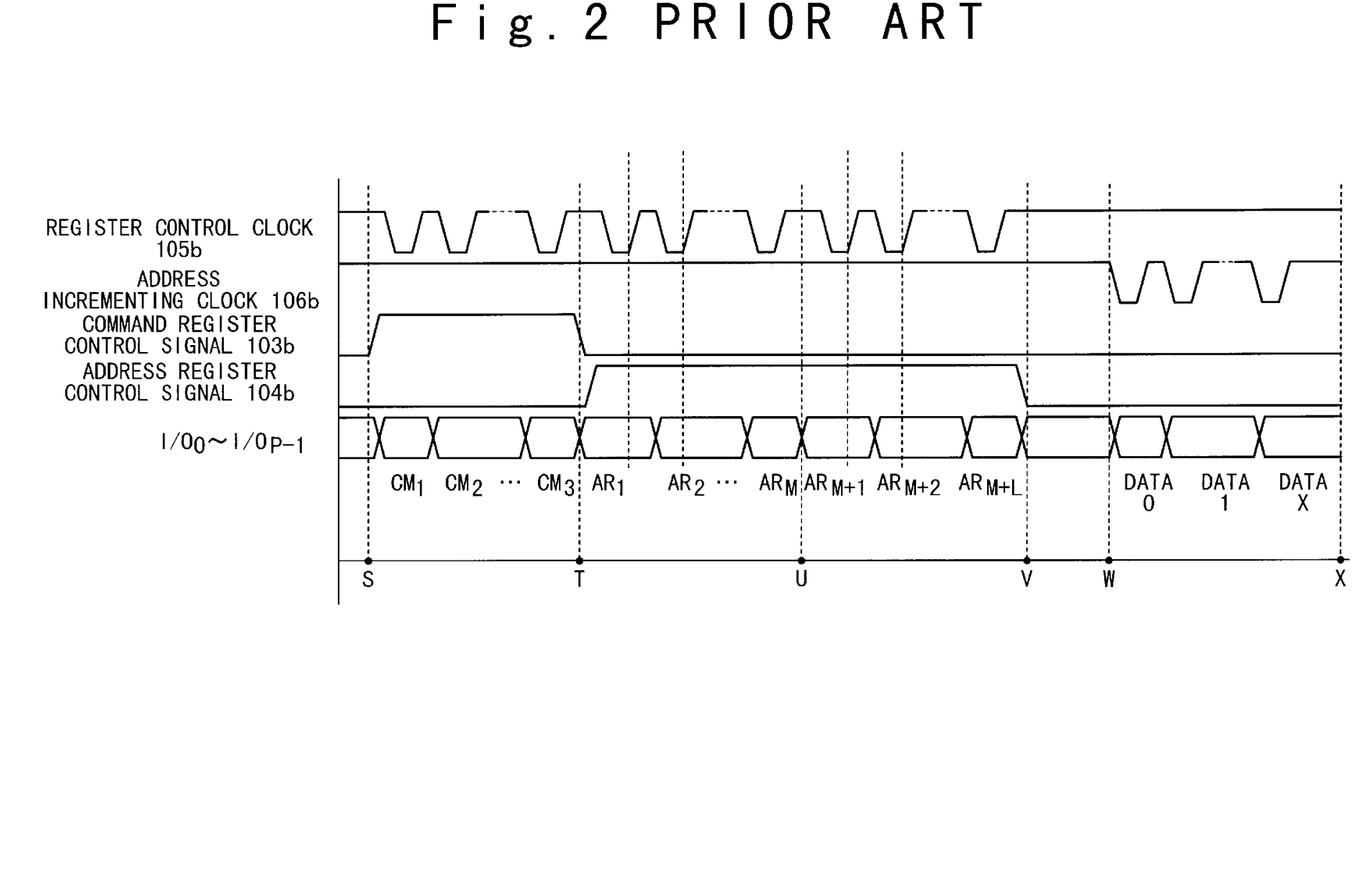
FIG. 2 is a timing chart showing operation of a conventional method of testing an address multiplexer memory having a serial access function.

FIG. 2 is a timing chart showing the operation of a conventional serial access memory device. At first, the command register control signal 103a is activated for a period from a time S to a time T. The command register control circuit 103, in response to the command register control signal 103a, sequentially activates the command registers $107_1$–$\omega_N$, while the command values $CM_1$–$CM_N$ are sequentially inputted to the I/O buffer 102. The command registers $107_1$–$107_N$ respectively latch the command values $CM_1$–$CM_N$ in synchronization with the register control clock signal 105b. The command decoder 108, in response to the command values $CM_1$–$CM_N$, outputs a command that determines an operating mode. The serial input of the command values $CM_1$–$CM_N$ requires N input cycles of the register control clock signal 105b.

Then, the address register control signal 104a is activated for a period from time T to time V. The address register control circuit 104, in response to the address register control signal 104a, sequentially activates the address registers $109_1$–$109_{M+L}$, while the initial values $AR_1$–$AR_{M+1}$ are sequentially inputted to the I/O buffer 102. The address registers $109_1$–$109_{M+L}$ respectively latch the initial address values $AR_1$–$AR_{M+L}$ in synchronization with the register control clock signal 105b. The serial input of the initial address values $AR_1$–$AR_{M+L}$ requires M+L input cycles of the register control clock signal 105b.

The counters $110_1$–$110_M$ respectively latch the initial address values $AR_1$–$AR_M$ and respectively initialize the address values $AAR_1$–$AAR_M$ to the initial address values $AR_1$–$AR_M$. As mentioned above, the address values $AAR_{M+}$–$AAR_{M+L}$, which are representative of the upper address, are respectively the same as the initial address values $AR_{M+1}$–$AR_{M+L}$. These result in that the address of a firstly accessed memory cell is set to be the initial address represented by the initial address values $AR_1$–$AR_{M+L}$.

Then the serial access to the memory cell array 113 is started at the time W. The address decoder 112 selects one of the memory cells on the basis of address values $AAR_1$–$AAR_{M+1}$, and allows the selected memory cell to be accessed. After every access to the memory cells, the address values $AAR_1$–$AAR_M$ are increased by the counters $110_1$–$110_M$ such that the accessed address is incremented. The increment of the accessed address achieves serial access to the memory cell array 113. In a read mode, the data stored in the memory cell array 113 is sequentially outputted.

In a memory device, the N command values and the (M+L) initial address values are serially inputted, and thus the input of the command values and initial address values requires (N+M+L) input cycles. That is, N input cycles for the command input and (M+L) input cycles for the initial address input.

The serial input increases the number of input cycles needed to input the test command and test address, and thus increases the testing time. The number of the input cycles tends to increase because of the progress in the function of the memory device and the increase in the capacity of the memory device. The increase of the number of input cycles is a serious problem, especially in a memory device having a small number of I/O pins therein. Also, the increase of the number of input cycles is enhanced as the memory devices increase in capacity and function.

Also, there is a limitation on the number of input cycles in a tester, especially, a tester for testing the durability of the device.

Therefore, it is desired that a number of input cycles needed to input a command and an address is reduced.

As another related technique, a built-in self-test (BIST) technique is widely known. A BIST circuit is disclosed in Japanese Laid Open Patent Application (JP-A-Showa 63-184989). The BIST circuit includes an internal clock generator, an internal address generator, and a test pattern generator and a comparator.

Another built-in self test (BIST) circuit is disclosed in Japanese Laid Open Patent Application (JP-A-Heisei 11-39226). A conventional memory device is provided for determining an address and a bit of a failed memory device without an increase in testing time and cost. The conventional memory device also enables the easy testing of an AC property, such as an access time.

A semiconductor device is provided with a memory including memory cells and a BIST circuit for testing the memory.

The BIST circuit is composed of a controller, an address generator, a data generator, a comparator, a scanning circuit, and a multiplexer. The controller outputs a control signal in response to a test start signal in synchronization with a test clock. The address generator provides an address signal for the memory in response to the control signal. The data generator provides test data for the memory cells in response to the control signal. The test data is read out from the memory cells. The comparator compares the actual read out data with the known input test data, and outputs an error signal if the input test data and the actual data are different from each other. The scanning circuit serially outputs the actual read out data and the address signal. The multiplexer selectively outputs the error signal from the comparator or outputs the actual read out data and the address signal from the scanning circuit in response to the control signal. When the comparator outputs the error signal, the actual read out data associated with the error signal is outputted from the multiplexer, and the address signal associated with the actual read out data is outputted from the multiplexer.

Still another conventional memory device including a BIST circuit is disclosed in Japanese Laid Open Patent Application (JP-A-Heisei 9-245498). The BIST circuit enables a profound function test with a simple configuration.

A memory device is provided with a memory cell array including memory cells, an address generator, a data storage circuit, and a test circuit. The address generator generates an address signal for addressing the memory cell array. The data storage circuit stores data and transfers it to or from the memory cell array. The test circuit, in response to a test mode signal, writes a test pattern to the memory cell array by controlling the address generator and the data storage circuit. The test circuit enables an automatic test including a series of write and read.

Yet still another memory device including BIST circuit for reducing a chip area thereof is disclosed in Japanese Laid Open Patent Application (JP-A-Heisei 10-162600). A memory device is provided with a memory cell and a BIST circuit. The BIST circuit includes a test clock generator, a column address counter, a low address counter, a data generating and comparing circuit, a timer, and a sequencer. The test clock generator generates a test clock that times the operation of the BIST circuit. The column address counter provides a column address of the memory cell to be accessed. The low address counter provides a row address of the cell to be accessed. The data generating and comparing circuit provides a test data for the memory cell array, and compares the read out data from the memory cell array with the input test data. The timer measures the time needed to test the memory cell array. The sequencer controls the test clock generator, the column address counter, the low address counter, the data generating and comparing circuit, and the timer. The sequencer is constituted by a sequential circuit, and thus the chip area of the memory device is reduced.

Still another memory device is disclosed in Japanese Laid Open Patent Application (JP-A-Heisei 2-28853). The memory device enables secret protection of a software program during testing.

The memory device is provided with a built-in memory including having a program memory, an address generator, an address decoder for generating an address of the program memory; an output circuit for reading out data stored in the program memory, a test controller for outputting an address control signal for controlling the address in response to a test signal, and an address controller for controlling the address control signal in the test control circuit so as to turn off the address control signal when the address becomes a predetermined address.

SUMMARY OF THE INVENTION

The object of the present invention is to provide a memory device for reducing input cycles needed to input a test pattern.

Another object of the present invention is to provide a memory device for simplifying a test pattern.

Still another object of the present invention is to provide a memory device for reducing the testing time.

In order to achieve an aspect of the present invention, a memory device is composed of a memory cell array including a plurality of memory cells, an I/O buffer, a command providing unit, an address providing unit, and an address decoder. The command providing unit is responsive to a test mode signal for providing a command that controls access to the memory cell array. The address providing unit provides an address in response to the command. The address decoder allows the memory cell array to be accessed in response to the address. The command providing unit sets the command to a predetermined internal command when the test mode signal is activated. The command providing unit, when the test mode signal is not activated, receives an external command through the I/O buffer and sets the command to an external command.

When the command providing unit includes a command register storing a command value, and a command decoder decoding the command value to generate the command, it is desirable that the command register fixes the command value to a predetermined command value when the test mode signal is activated, and that the command register latches an external command value representative of the external command to set the command value to be the external command value.

Also, the command providing unit preferably includes a command register storing a command value, the command register latching through the I/O buffer an external command value representative of the external command, and a command decoder, the command decoder fixing the command to a predetermined command when the test mode signal is activated, and the command decoder decoding the command value to generate the command when the test mode signal is not activated.

The address providing unit may initialize the address to an initial address before the access and increment the address from the initial address during the access. In this case, It is preferable that the address providing unit, when the test mode signal is activated, fixes the initial address to a predetermined initial address, and when the test mode signal is not activated, the address providing unit receives an external initial address through the I/O buffer and sets the initial address to be the external initial address.

The address providing unit preferable includes an address register storing an initial address, the address register fixing the initial address to a predetermined initial address when the test mode signal is activated, and the address register receiving an external initial address through the I/O buffer to set the initial address to be the external initial address, and an address increment unit which provides the address, the address increment unit initializing the address to the initial address before the access, and the address increment unit increasing the address during the access in response to an address increment clock signal.

When the address includes an upper address, and a lower address, and the address providing unit preferably includes an upper address register storing the upper address, a lower address register storing an initial lower address, the lower address register fixing the lower initial address to a predetermined lower initial address when the test mode signal is activated, and the address register receives an external initial lower address through the I/O buffer to set the initial lower address to be the external initial lower address, and a counter providing the lower address, the counter initializing the lower address to the initial lower address value before the access and the counter increasing the lower address from the initial lower address in response to an address increment clock signal.

In this case, the first address register preferably receives an external upper address whenever the test mode signal is activated or not.

It is also preferable that the first address register fixes the upper address to a predetermined upper address when the test mode is activated, and that the first address register receives an external upper address through the I/O buffer to initialize the upper address to the external upper address when the test mode is not activated.

In order to achieve another aspect of the present invention, a memory device is implemented with a memory cell array including a plurality of memory cells, an I/O buffer, an address providing unit, and an address decoder. The address providing unit is responsive to a test mode signal for providing an address. The address providing unit initializes the address to an initial address before an access to the memory cell array, and increments the address from initial address during the access. The address decoder allows the memory cell array to be accessed in response to the address. The address providing unit, when the test mode signal is activated, fixes the initial address to a predetermined initial address, and, when the test mode signal is not activated, the address providing unit receives an external initial address through the I/O buffer to set the initial address to be the external initial address.

The address providing unit preferably includes an address register storing the initial address, the address register fixing the initial address to a predetermined initial address when the test mode signal is activated, and the address register receiving an external initial address through the I/O buffer to set the initial address to be the external initial address, and an address increment unit which provides the address, the address increment unit initializing the address to the initial address before the access, and the address increment unit increasing the address during the access in response to an address increment clock signal.

When the address includes an upper address and a lower address, the address providing unit preferably includes an upper address register storing the upper address, a lower address register storing an initial lower address, the lower address register fixing the lower initial address to a predetermined lower initial address when the test mode signal is activated, and the address register receives an external initial lower address through the I/O buffer to set the initial lower address to be the external initial lower address, and a counter providing the lower address, the counter initializes the lower address to the initial lower address value before the access and the counter increasing the lower address from the initial lower address in response to an address increment clock signal.

The first address register preferably receives an external upper address whenever the test mode signal is activated or not.

It is also preferable that the first address register fixes the upper address to a predetermined upper address when the test mode is activated, and the first address register receives an external upper address through the I/O buffer to initialize the upper address to the external upper address when the test mode is not activated.

In order to achieve still another aspect of the present invention, a method of operating a memory device is composed of:

providing a test mode signal;

providing a command which controls access to a memory cell, providing the command including:

setting the command to be a predetermined internal command when the test mode signal is activated, and setting the command to be an external command received from an external circuit when the test mode signal is not activated;

providing an address in response to the command; and allowing the memory cell array to be accessed in response to the address.

In order to achieve yet still another aspect of the present invention, a method of operating a memory device is composed of:

providing a test mode signal;

providing an address for access to a memory cell array;

allowing the memory cell array to be accessed in response to the address, the providing the address including:

initializing the address to a predetermined initial address before the access when the test mode signal is activated;

initializing the address to an external initial address received from an external circuit before the access when the test mode signal is not activated;

incrementing the address during the access.

BRIEF DESCRIPTION OF THE DRAWINGS

FIG. 5 is a view showing an address map of the memory device in;

DESCRIPTION OF THE PREFERRED EMBODIMENTS

Embodiments of a serial access memory according to the present invention will be described below in detail with reference to the attached drawings.

First Embodiment

Figure 3:
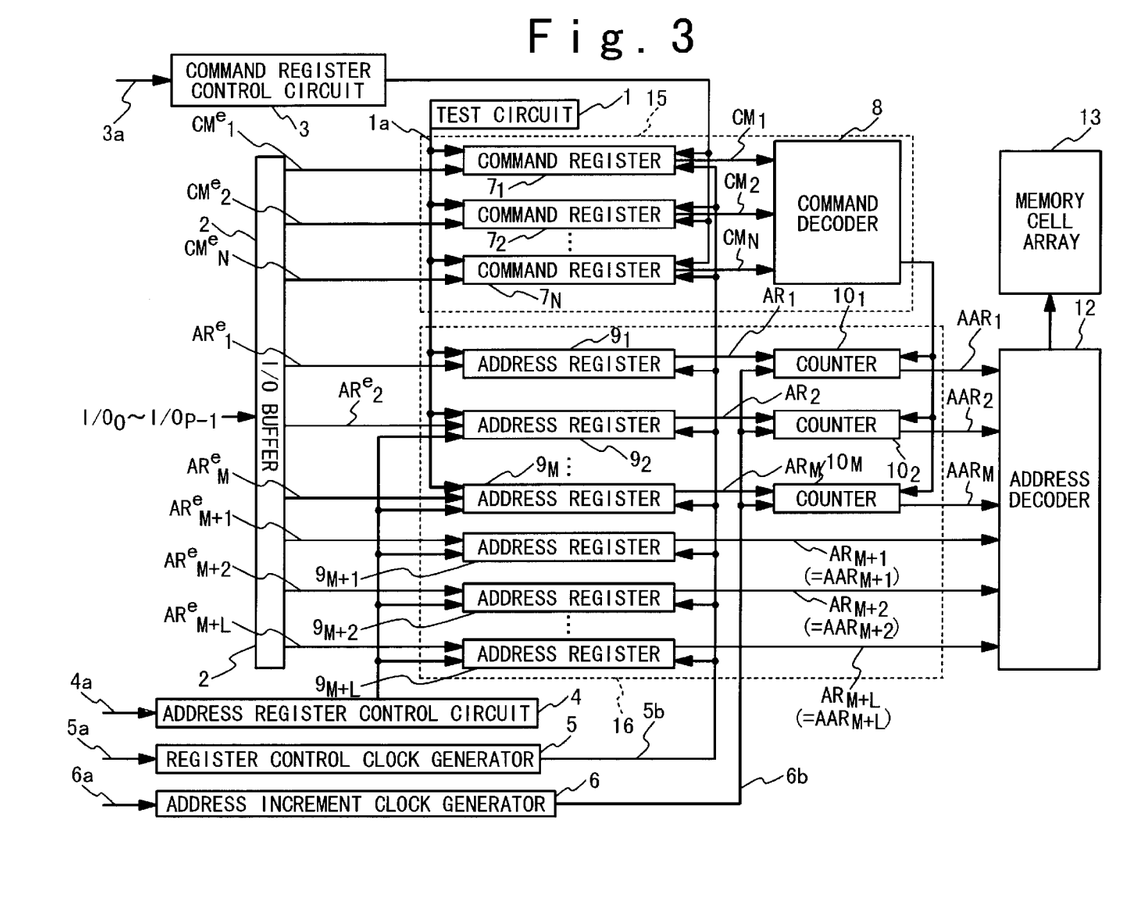
FIG. 3 is a block diagram of a memory device in a first embodiment according to the present invention.

The memory device in the first embodiment executes a serial access. As shown in FIG. 3, the memory device is composed of a test circuit 1, an I/O buffer 2, a command register control circuit 3, an address register control circuit 4, a register control clock generator 5, an address increment clock generator 6, command registers $7_1$–$7_N$, a command decoder 8, address registers $9_1$–$9_{M+L}$, counters $10_1$–$10_M$, an address decoder 12, and a memory cell array 13. The memory cell array 13 includes memory cells arranged in rows and columns. The command registers $7_1$–$7_N$ and the command decoder 8 constitute a command providing unit 15 which provides an internal command determining an operation mode of the memory device. The address registers $9_1$–$9_{M+L}$ and the counters $10_1$–$10_M$ constitute an address providing unit 16 that provides an address of the memory cell to be accessed.

The test circuit 1 activates a test mode signal 1a during the testing of the memory device. That is, the test mode signal 1a is representative of whether the memory device operates in a test mode or not. The test mode signal 1a is outputted to the command registers $7_1$–$7_M$ and the address registers $9_1$–$9_M$. It should be noted that the address registers $9_{M+1}$–$9_{M+L}$ are not provided with the test mode signal 1a in the first embodiment.

The I/O buffer 2 receives a set of signals $I/O_{00}$-$I/O_{P-1}$ from an external circuit (not shown). The signals $I/O_0$-$I/O_{P-1}$ transfer a test pattern including an external command and an external initial address given by the external circuit.

The external command is represented by N command values $CM^e_1$–$CM^e_N$, and the external initial address is represented by (M+L) external initial address values $AR^e_1$–$AR^e_{M+L}$, where N, M, and L are an integer. The N, M, and L are determined on the basis of the scale of the memory device. In detail, among the external initial address values $AR^e_1$–$AR^e_{M+L}$, the external initial address values $AR^e_1$–$AR^e_M$ are representative of the initial lower address of the memory cell to be firstly accessed, while the external initial address values $AR^e_{M+1}$–$AR^e_{M+L}$ are representative of the initial upper address.

Each of the N command values $CM^e_1$–$CM^e_N$ and the (M+L) external initial address values $AR^e_1$–$AR^e_{M+L}$ are constituted by P bits, each of which is respectively associated with I/O signals $I/O_0$-$I/O_{P-1}$.

The signals $I/O_0$-$I/O_{P-1}$ are demultiplexed by the I/O buffer 2 to deliver the external command values $CM^e_1$–$CM^e_N$ respectively to the command registers $7_1$–$7_N$, and the external initial address values $AR^e_1$–$AR^e_{M+L}$ respectively to the address registers $9_1$–$9_{M+L}$.

When the memory device operates in the test mode, however, the N external command values $CM^e_1$–$CM^e_N$ are not inputted to the I/O buffer 2. In addition, among the (M+L) external initial address values $AR_1^e$–$AR^e_{M+L}$, only the external initial address values $AR_{M+1}^e$–$AR^e_{M+L}$ are inputted to the I/O buffer 2. That is, when the memory device operates in the test mode, the external initial address values $AR_1^e$–$AR^e_M$ are not inputted to the I/O buffer 2. During the test mode, the memory device operates without the external command values $CM^e_1$–$CM^e_N$ and the external initial address values $AR_1^e$–$AR^e_M$.

The command register control circuit 3 is responsive to a command register control signal 3a for sequentially activating the command registers $7_1$–$7_N$.

The address register control circuit 4 is responsive to an address register control signal 4a for sequentially activating the address registers $9_1$–$9_{M+L}$.

The register control clock generator 5 is responsive to an external clock signal 5a for developing a register control clock signal 5b. The register control clock signal 5b is outputted to the command registers $7_1$–$7_N$ and the address registers $9_1$–$9_{M+L}$, and thus the activation of the command registers $7_1$–$7_N$ and the address registers $9_1$–$9_{M+L}$ are timed by the register control clock signal 5b.

The address increment clock generator 6 is responsive to another external clock signal 6a for developing an address increment clock signal 6b. The address increment clock signal 6b is outputted to the counter $10_1$–$10_M$.

The command registers $7_1$–$7_N$ stores command values $CM_1$–$CM_N$. The command values $CM_1$–$CM_N$ are representative of an internal command that determines an operation mode of the memory device.

The storage of the command values $CM_1$–$CM_N$ is executed in response to the test mode signal 1a. When the test mode signal 1a is not activated, the command registers $7_1$–$7_N$ respectively latch the external command values $CM^e_1$–$CM^e_N$ to store them therein. The command registers $7_1$–$7_N$, in response to command register control signal 3a, are sequentially activated in synchronization with inputs of the external command values $CM^e_1$–$CM^e_N$ to the I/O buffer 2. When activated, the command registers $7_1$–$7_N$ respectively latch the external command values $CM^e_1$–$CM^e_N$ therein, and set the command values $CM_1$–$CM_N$ to be the external command values $CM^e_1$–$CM^e_N$.

On the other hand, when the test mode signal 1a is activated, the command registers $7_1$–$7_N$ respectively fix the command values $CM_1$–$CM_N$ to predetermined command values. That is, the command registers $7_1$–$7_N$ refuse to receive the external command values $CM^e_1$–$CM^e_N$. This operation of the comp-land registers $7_1$–$7_N$ eliminates the necessity of input of the external command values $CM^e_1$–$CM^e_N$ during the testing of the memo device.

The command values $CM_1$–$CM_N$, which may be external command values $CM^e_1$–$CM^e_N$ or the predetermined command values, are outputted to the command decoder 8.

The command decoder 8 decodes the command values $CM_1$–$CM_N$ to determine the internal command to be executed in the memory device. The command decoder 8 provides the internal command with the counters $10_1$–$10_M$.

The address register $9_1$–$9_{M+L}$ respectively store initial address values $AR_1$–$AR_{M+L}$. The initial address values $AR_1$–$AR_{M+L}$ are representative of the initial address of the memory cell to be firstly accessed in a serial access. In detail, the initial address values $AR_1$–$AR_M$ are representative of the initial lower address of the memory cell to be firstly accessed in the serial access. On the other hand the initial address values $AR_{M+1}$–$AR_{M+L}$ are representative of the initial upper address.

Among the address registers $9_1$–$9_{M+L}$, the address registers $9_1$–$9_M$ are responsive to the test mode signal 1a. When the test mode signal 1a is activated, the address registers $9_1$–$9_M$ respectively latch the external initial address values $AR^e_1$–$AR^e_M$. The address registers $8_1$–$8_M$, in response to the address register control signal 4a, are sequentially activated in synchronization with inputs of the external initial address values $AR^e_1$–$AR^e_M$ to the I/O buffer 2. When activated, the address registers $8_1$–$8_M$ respectively latch the external initial address values $AR^e_1$–$AR^e_M$ therein, and set the initial address values $AR_1$–$AR_M$ to be the external command values $AR^e_1$–$AR^e_M$. On the other hand, when test mode signal 1a is activated, the address registers $9_1$–$9_M$ respectively set the initial address values $AR_1$–$AR_M$ to be predetermined initial address values.

The initial address values $AR_1$–$AR_M$ are respectively outputted to the counters $10_1$–$10_M$ from the address registers $9_1$–$9_M$.

The remaining address registers $9_{M+1}$–$9_{M+L}$ are not responsive to the test mode signal 1a. The address registers $9_{M+1}$–$9_{M+L}$ respectively latch the external initial address values $AR^e_{M+1}$–$AR^e_{M+L}$ to store them as the initial address values $AR_{M+1}$–$AR_{M+L}$. The address registers $9_{M+1}$–$9_{M+L}$, in response to the address register control signal 4a, are sequentially activated in synchronization with inputs of the external initial address values $AR^e_{M+1}$–$AR^e_{M+L}$ to the I/O buffer 2. When activated, address registers $9_{M+1}$–$9_{M+L}$ set the initial address values $AR_{M+1}$–$AR_{M+1}$ to be the eternal initial address value $AR^e_{M+1}$–$AR^e_{M+L}$.

Since all the memory cells accessed during the serial access have the same upper address, the address values $AAR_{M+1}$–$AAR_{M+L}$, which are representative of the upper address of the accessed memory cell, are respectively identical to the initial address values $AR_{M+1}$–$AR_{M+L}$ that are representative of the initial upper address. The initial address values $AR_{M+1}$–$AR_{M+L}$ are outputted to the address decoder 12, and the address decoder 12 recognizes the initial address values $AR_{M+L}$–$AR_{M+L}$ as the address values $AAR_{M+1}$–$AAR_{M+L}$.

The counters $10_1$–$10_M$ respectively generate address values $AAR_1$–$AAR_M$ which are representative of a lower address of the memory cell to be accessed. At the beginning of the serial access, the counters $10_1$–$10_M$ respectively receive the initial address values $AR_1$–$AR_M$ from the address registers $9_1$–$9_M$ to initialize the address values $AAR_1$–$AAR_M$ respectively to the initial address values $AR_1$–$AR_M$. During the serial access, the counters $10_1$–$10_M$ respectively increment the address values $AAR_1$–$AAR_M$, and thereby increment the lower address of the accessed memory cell. The increment of the address values $AAR_1$–$AAR_M$ is synchronized with the address increment clock signal 6b.

Also, the counters $10_1$–$10_M$ also control the address values $AAR_1$–$AAR_M$ in response to the internal command provided by the command decoder 8. The counters $10_1$–$10_M$ output the address values $AAR_1$–$AAR_M$ to the address decoder 12.

The address decoder 12 receives the address values $AAR_1$–$AAR_M$ from the counters $10_1$–$10_M$ and the address values $AAR_{M+1}$–$AAR_{M+L}$ from the address registers $9_{M+1}$–$9_{M+1}$. The address decoder 12 decodes the address values $AAR_1$–$AAR_{M+L}$ to allow one of the memory cells in the memory cell array 13 to be accessed.

The memory device further includes a write driver for writing data to the memory cells and a sense amplifier for reading data from the memory cells. Those who are skilled in the art will easily realize the configuration of the memory device without a detailed explanation.

Figure 4:
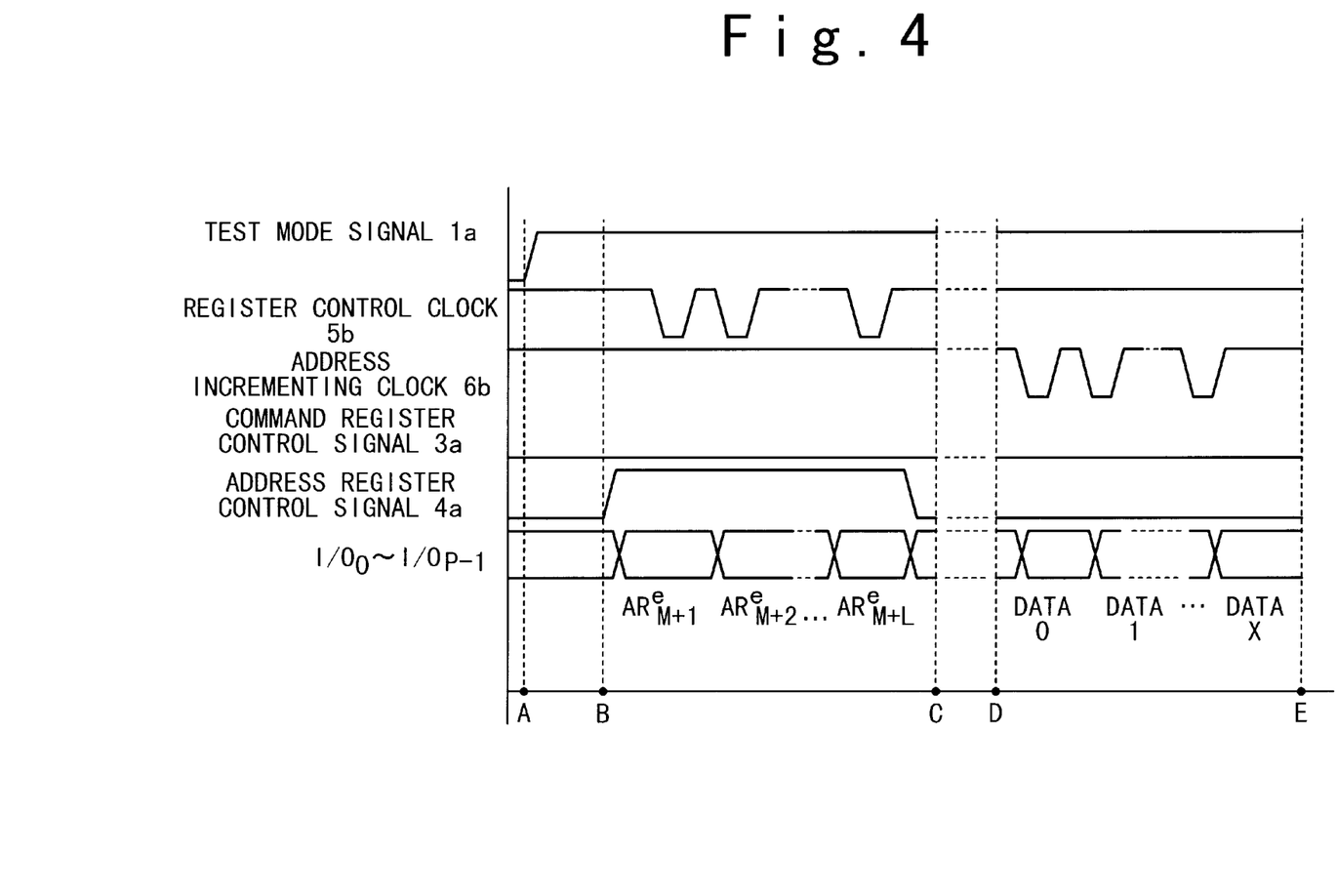
FIG. 4 is a timing chart showing operation of the memory device according to the first embodiment.

FIG. 4 is a timing chart showing the operation of the memory device during the testing thereof. At the time A when the testing of the memory device is stated, the test circuit 1 activates the test mode signal 1a.

The command registers $7_1$–$7_N$, in response to the test mode signal 1a, respectively set the command values $CM_1$–$CM_N$ stored therein to be the predetermined command values. The command values $CM_1$–$CM_N$ are not affected by the input of the signals $I/O_0$–$I/O_{P-1}$, and are controlled only by the test mode signal $1a$.

Then, the command decoder 8 decodes the command values $CM_1$–$CM_N$ to determine the internal command to be executed in the memory device. The command values $CM_1$–$CM_N$ fixed to the predetermined command values makes the command decoder 8 provide a predetermined internal command during the testing of the memory device.

In the meantime, the address registers $9_1$–$9_M$, in response to the test mode signal $1a$, respectively set the initial address values $AR_1$–$AR_M$ stored therein to be the predetermined initial address values. The initial address values $AR_1$–$AR_M$ are not affected by the input of the I/O signals $I/O_0$–$I/O_{P-1}$ and are controlled only by the test mode signal $1a$. The fixed initial address values $AR_1$–$AR_M$ are respectively outputted to the counters $10_1$–$10_M$. The counters $10_1$–$10_M$ initialize the address values $AAR_1$–$AAR_M$ to the fixed initial address values $AR_1$–$AR_M$. This results in that the initial lower address is predetermined during the testing of the memory device.

Then, the address register control signal $4a$ is activated for a period from time B to time C. While the address register control signal $4a$ is activated, the external address values $AR^e_{M+1}$–$AR^e_{M+L}$ are sequentially inputted to the I/O buffer 2. The address register control circuit 4 sequentially activates the address registers $9_{M+1}$–$9_{M+L}$ without activating the address registers $9_1$–$9_M$. The address registers $9_{M+1}$–$9_{M+L}$ respectively latch the external address values $AR^e_{M+1}$–$AR^e_{M+L}$ to store them therein as the initial address values $AR_{M+1}$–$AR_{M+L}$. The initial address values $AR_{M+1}$–$AR_{M+L}$ are outputted to the address decoder 12 and the address decoder 12 receives them as the address values $AAR_{M+1}$–$AAR_{M+L}$.

Figure 5:
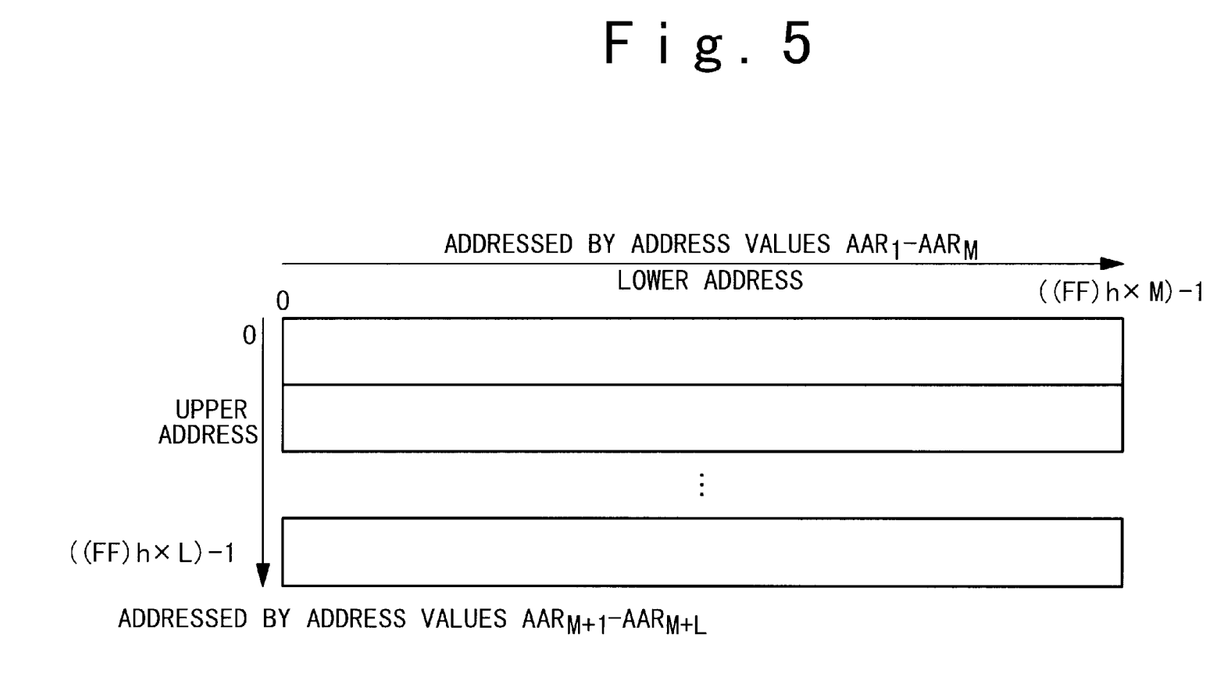

With reference to FIG. 5, The initial address of the serial access is composed of the initial upper address represented by the initial address values $AR_{M+1}$–$AR_{M+L}$ and the initial lower address is represented by the initial address values $AR_1$–$AR_M$.

Then the serial access is started at time D. The address decoder 12 decodes the address values $AAR_1$–$AAR_{M+L}$ to select one of the memory cells in the memory cell array 13. The address decoder 12 allows the selected memory cell to be accessed.

After every access to the memory cells, the address values $AAR_1$–$AAR_M$ are increased by the counters $10_1$–$10_M$ such that the address of the memory cell to be accessed is incremented. The increment of the accessed address achieves the serial access to the memory cell array 13.

In the first embodiment, The input of the command during the test mode is not necessary, and thus the number of input cycles for inputting the test pattern is reduced. In addition, the input of the initial lower address during the test mode is not necessary, and thus the number of input cycles for inputting the test pattern is further reduced. The reduction of the input cycles shortens the testing time and also reduces the complexity of the test pattern. The reduced testing time and complexity is of much importance in executing a reliability test and an LFT (Loose Function Test) of the memory device.

Second Embodiment

Figure 6:
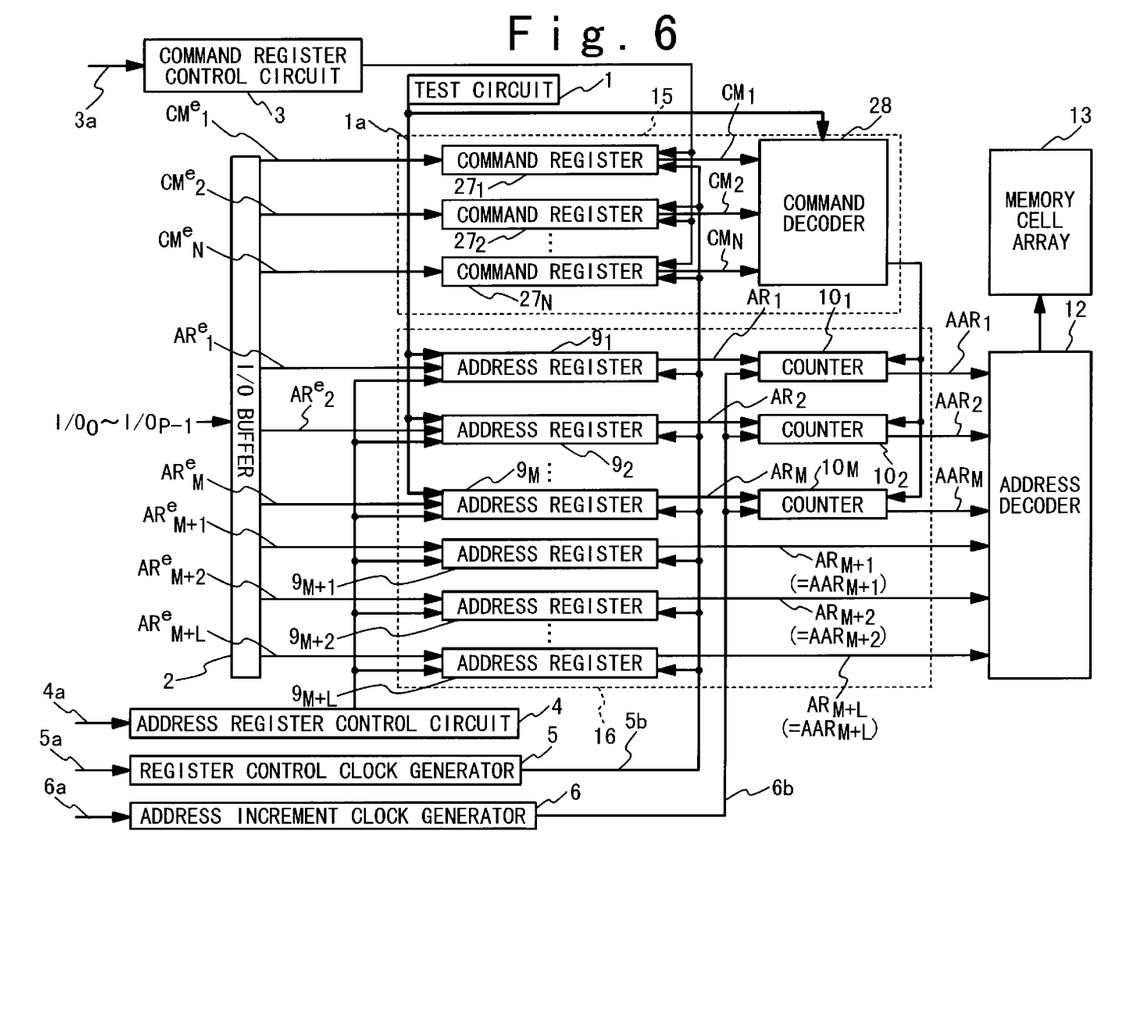
FIG. 6 is a block diagram of a memory device in a second embodiment.

In a second embodiment, the operations of the command registers $7_1$–$7_N$ and the command decoder 8 are modified. The configuration of the memory device in the second embodiment is identical to that in the first embodiment except for the command registers $7_1$–$7_N$ and the command decoder 8. Hereinafter, as shown in FIG. 6, the modified command registers $7_1$–$7_N$ and the command decoder 8 are respectively denoted by command registers $27_1$–$27_N$ and a command decoder 28.

In the second embodiment, the test mode signal $1a$ is outputted to the command decoder 28 instead of the command registers $27_1$–$27_N$.

While the test mode signal $1a$ is not activated, the command registers $27_1$–$27_N$ are sequentially activated in synchronization with the sequential inputs of the external command values $CM^e_1$–$CM^e_N$. The command registers $27_1$–$27_N$ respectively latch the external command values $CM^e_1$–$CM^e_N$ and respectively set the command values $CM_1$–$CM_N$ to be the external command values $CM^e_1$–$CM^e_N$. The command registers $27_1$–$27_N$ respectively output the command values $CM_1$–$CM_N$ to the command decoder 28.

While the test mode signal $1a$ is activated, on the other hand, the command registers $27_1$–$27_N$ are inactivated by the command register control circuit 3, and the input of the external command values $CM^e_1$–$CM^e_N$ is not executed. Alternatively, the command decoder 28 provides the predetermined internal command for the counters $10_1$–$10_M$ in response to the test mode signal $1a$, and thereby eliminates the necessity of input of the external command values $CM^e_1$–$CM^e_N$.

The memory device in the second embodiment also reduces the number of the input cycles for inputting the test pattern.

In addition, the memory device in the second embodiment is preferable in terms of the operation speed and the chip size thereof. In the second embodiment, the test circuit 1 is connected to the command decoder 28 not to the command registers $27_1$–$27_N$. The connection of the test circuit 1 reduces the capacitance of the signal line that transmits the test mode signal $1a$, and also reduces the occupied area thereof.

Third Embodiment

Figure 7:
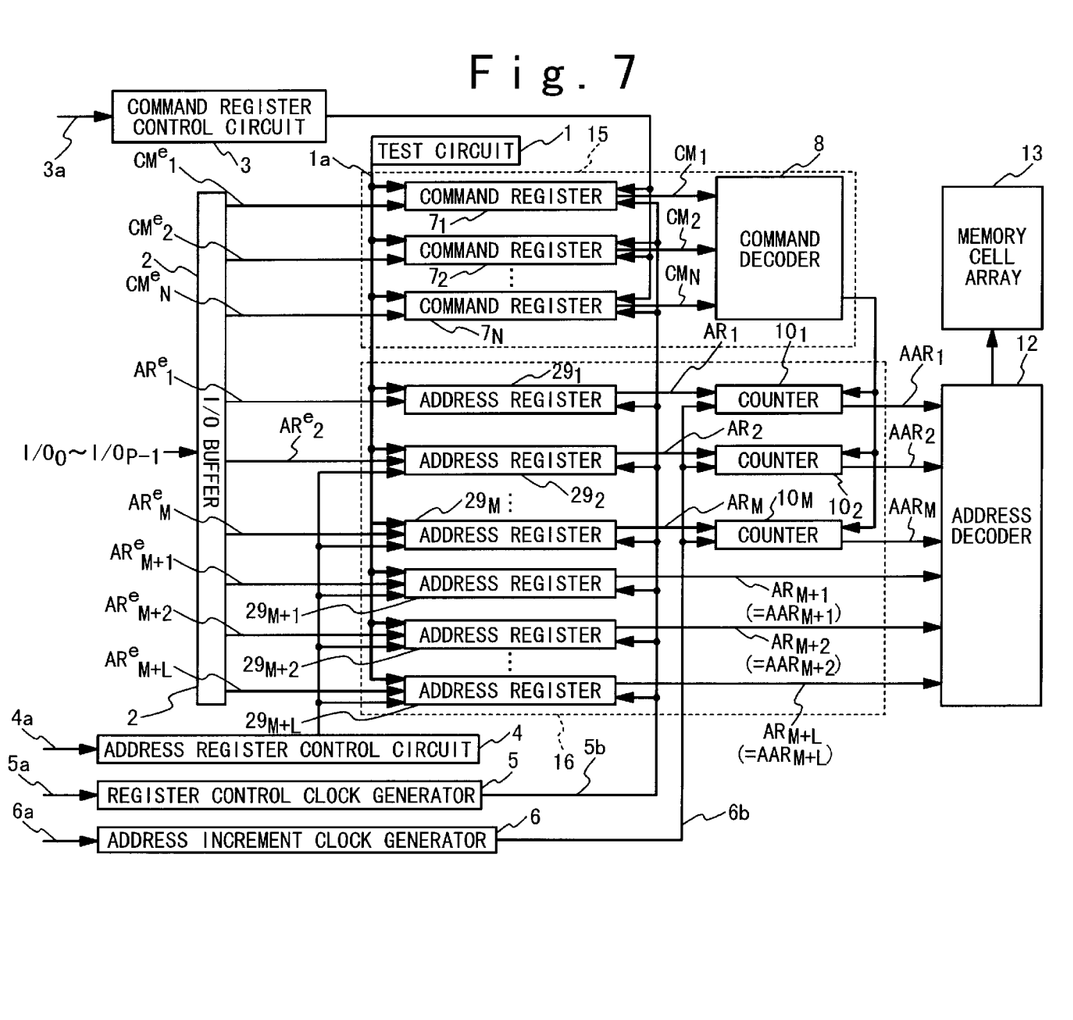
FIG. 7 is a block diagram of a memory device in a third embodiment.

In a third embodiment, the operations of the address registers $9_1$–$9_{M+L}$ are modified. The configuration of the memory device in the third embodiment is identical to that in the first embodiment except for the address registers $9_1$–$9_{M+L}$. Hereinafter, as shown in FIG. 7, the modified address registers $9_1$–$9_{M+L}$ are respectively denoted by address registers $29_1$–$29_{M+L}$.

In the third embodiment, all the address registers $29_1$–$29_{M+L}$ are responsive to the test mode signal $1a$. When the test mode signal $1a$ is not activated, the address registers $29_{M+1}$–$29_{M+L}$ are sequentially activated in synchronization with the sequential inputs of the external initial address values $AR^e_1$–$AR^e_{M+L}$. The address registers $29_1$–$29_{M+L}$ respectively latch the external initial address values $AR^e_1$–$AR^e_{M+L}$ and respectively set the initial address values $AR_1$–$AR_{M+L}$ to be the external initial address values $AR^e_1$–$AR^e_{M+L}$. The address registers $29_1$–$29_{M+L}$ respectively outputs the external initial address values $AR^e_1$–$AR^e_{M+L}$ as the initial address values $AR_1$–$AR_{M+L}$.

While the test mode signal $1a$ is activated, on the other hand, the address registers $29_1$–$29_{M+L}$ respectively set the initial address values $AR_{M+1}$–$AR9_{M+L}$ to be predetermined initial address values. The address registers $29_1$–$29_{M+L}$ do not receive the external initial address values $AR^e_1$–$AR^e_{M+L}$ from the I/O buffer 2. The address registers $29_1$–$29_{M+L}$ respectively output the predetermined initial address values as the initial address values $AR_1$–$AR_{M+L}$.

The initial address values $AR_1$–$AR_M$ are outputted to the counters $10_1$–$10_M$, and the counters $10_1$–$10_M$ respectively initialize the address values $AAR_1$–$AAR_M$ to the initial values $AR_1$–$AR_M$. The counters $10_1$–$10_M$ provide the address decoder 12 with the address values $AAR_1$–$AAR_M$.

In the meantime, the initial address values $AR_{M+1}$–$AR_{M+L}$ are outputted to the address decoder 12, and the address decoder 12 recognizes the initial address values $AR_{M+1}$–$AR_{M+L}$ as the address values $AAR_{M+1}$–$AR_{M+L}$. The address decoder 12 decodes the address values $AAR_1$–$AAR_{M+L}$ to select one of the memory cells. The address decoder 12 allows the selected memory cell to be accessed.

Figure 8:
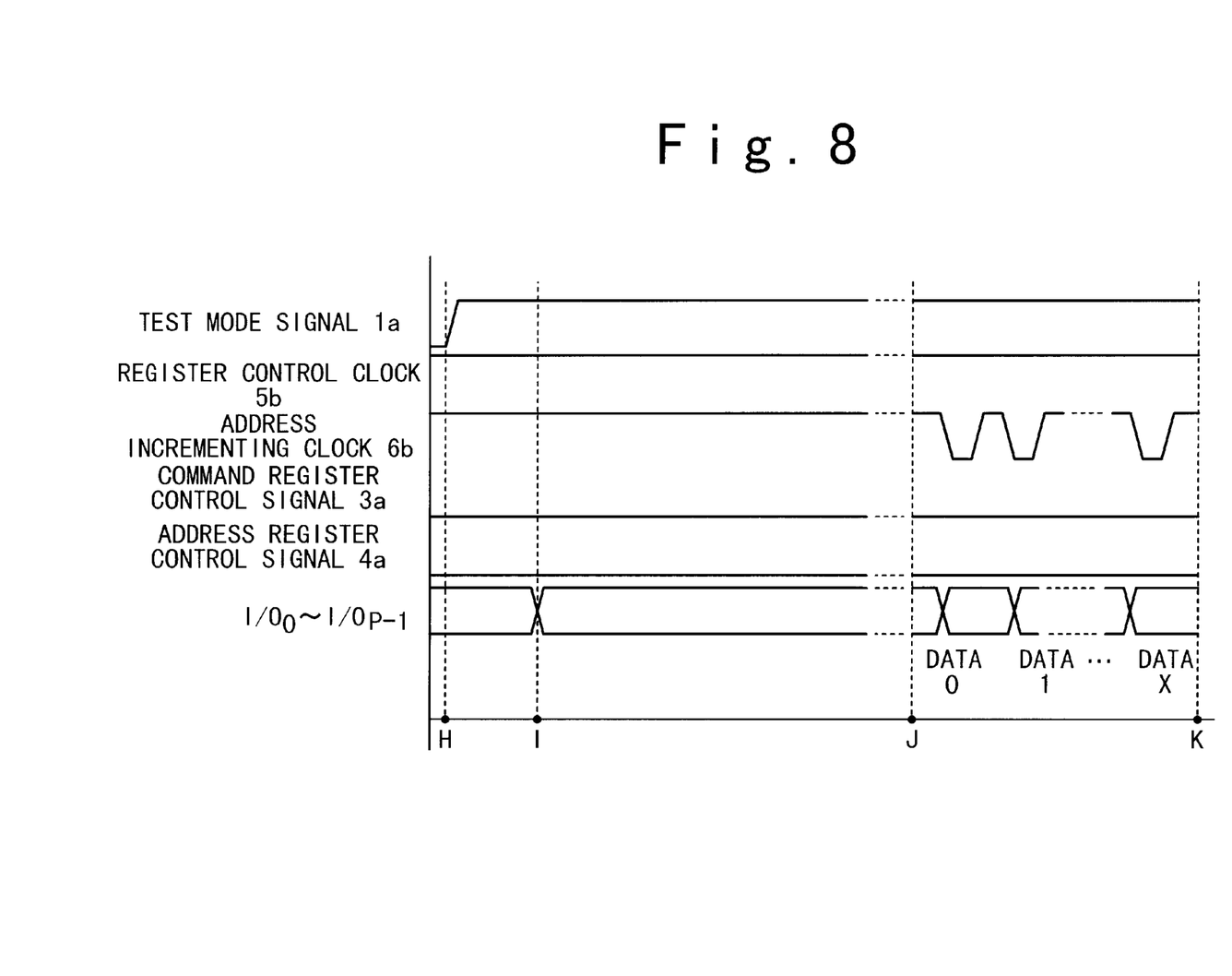
FIG. 8 chart showing operation of the memory device according to the third embodiment.

FIG. 8 is a timing chart showing the operation of the memory device in the third embodiment. At time H when the testing of the memory device is started, the test circuit 1 activates the test mode signal 1a.

The command registers $7_1$–$7_N$, in response to the test mode signal 1a, respectively set the command values $CM_1$–$CM_N$ stored therein to be the predetermined command values. The command values $CM_1$–$CM_N$ are not affected by the input of the I/O signals $I/O_0$–$I/O_{P-1}$ and are controlled only by the test mode signal 1a.

The command decoder 8 decodes the command values $CM_1$–$CM_N$ to determine the internal command to be executed in the memory device. The command values $CM_1$–$CM_N$ fixed to the predetermined command values make the command decoder 8 provide a predetermined internal command during the testing of the memory device.

In the meantime, the address registers $9_1$–$9_{M+L}$ in response to the test mode signal 1a, respectively set the initial address values $AR_1$–$AR_{M+L}$ to be the predetermined initial address values. The initial address values $AR_1$–$AR_{M+L}$ are not affected by the input of the signals $I/O_0$–$I/O_{P-1}$ and are controlled only by the test mode signal 1a. Among the initial address values $AR_1$–$AR_M$, the initial address values $AR_1$–$AR_M$ are respectively outputted to the counters $10_1$–$10_M$. The counters $10_1$–$10_M$ respectively initialize the address values $AAR_1$–$AAR_M$ to the fixed initial address values $AR_1$–$AR_M$. This results in that the initial lower address is predetermined during the testing of the memory device. The counters $10_1$–$10_M$ respectively output the address values $AAR_1$–$AAR_M$ to the address decoder 12.

On the other hand, the initial address values $AR_{M+1}$–$AR_{M+L}$ are directly outputted to the address decoder 12. The address decoder 12 recognizes the initial address values $AR_{M+1}$–$AR_{M+L}$ as the address values $AAR_{M+1}$–$AAR_{M+L}$.

Then, the serial access is started at time J. The address decoder 12 decodes the address values $AAR_1$–$AAR_{M+L}$ to select one of the memory cells in the memory cell array 13. The address decoder 12 allows the selected memory cell to be accessed.

After every access to the memory cells, the address values $AAR_1$–$AAR_M$ are increased by the counters $10_1$–$10_M$ such that the address of the memory cell to be accessed is incremented. The increment of the accessed address achieves the serial access to the memory cell array 13.

In the third embodiment, the memory device requires no input of the external command and initial address and thus reduces the number of the input cycles for inputting the test pattern.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A memory device comprising:
    a memory cell array including a plurality of memory cells;
    an I/O buffer;
    a command providing unit responsive to a test mode signal for providing a command which controls an access to said memory cell array; wherein said command providing unit sets said command to be a predetermined internal command when said test mode signal is activated, and said command providing unit, when said test mode signal is not activated, receives an external command through said I/O buffer and sets said command to be said external command;
    an address providing unit providing an address in response to said command; and
    an address decoder which allows said memory cell array to be accessed in response to said address.

2. The memory device according to claim 1, wherein said command providing unit includes:
    a command register storing a command value, and
    a command decoder decoding said command value to generate said command, and
    wherein said command register fixes said command value to a predetermined command value when said test mode signal is activated, and
    wherein said command register latches an external command value representative of said external command to set said command value to be said external command value.

3. The memory device according to claim 1, wherein said command providing unit includes:
    a command register storing a command value, said command register latching through said I/O buffer an external command value representative of said external command; and
    a command decoder, said command decoder fixing said command to a predetermined command when said test mode signal is activated, and said command decoder decoding said command value to generate said command when said test mode signal is not activated.

4. The memory device according to claim 1, wherein said address providing unit initializes said address to an initial address before said access, and increments said address from said initial address during said access, and
    wherein said address providing unit, when said test mode signal is activated, fixes said initial address to a predetermined initial address, and
    wherein said address providing unit, when said test mode signal is not activated, receives an external initial address through said I/O buffer and sets said initial address to be said external initial address.

5. The memory device according to claim 1, wherein and said address providing unit includes:
    an address register storing an initial address, said address register fixing said initial address to a predetermined initial address when said test mode signal is activated, and said address register receiving an external initial address through said I/O buffer to set said initial address to be said external initial address, and
    an address increment unit which provides said address, said address increment unit initializing said address to said initial address before said access, and said address increment unit increasing said address during said access in response to an address increment clock signal.

6. The memory device according to claim 1, wherein said address includes:

an upper address, and a lower address, and said address providing unit includes:

an upper address register storing said upper address, a lower address register storing an initial lower address, said lower address register fixing said lower initial address to a predetermined lower initial address when said test mode signal is activated, and said address register receives an external initial lower address through said I/O buffer to set said initial lower address to be said external initial lower address, and a counter providing said lower address, said counter initializing said lower address to said initial lower address value before said access and said counter increasing said lower address from said initial lower address in response to an address increment clock signal.

7. The memory device according to claim 6, wherein said first address register receives an external upper address whenever said test mode signal is activated or not.

8. The memory device according to claim 6, wherein said first address register fixes said upper address to a predetermined upper address when said test mode is activated, and said first address register receives an external upper address through said I/O buffer to initialize said upper address to said external upper address when said test mode is not activated.

9. A memory device comprising:

a memory cell array including a plurality of memory cells;

an I/O buffer;

an address providing unit responsive to a test mode signal for providing an address, wherein said address providing unit initializes said address to an initial address before an access to said memory cell array, and increments said address from initial address during said access; and an address decoder which allows said memory cell array to be accessed in response to said address, wherein said address providing unit, when said test mode signal is activated, fixes said initial address to a predetermined initial address, and wherein said address providing unit, when said test mode signal is not activated, receives an external initial address through said I/O buffer to set said initial address to be said external initial address.

10. The memory device according to claim 9, wherein said address providing unit includes:

an address register storing said initial address, said address register fixing said initial address to a predetermined initial address when said test mode signal is activated, and said address register receiving an external initial address through said I/O buffer to set said initial address to be said external initial address, and an address increment unit which provides said address, said address increment unit initializing said address to said initial address before said access, and said address increment unit increasing said address during said access in response to an address increment clock signal.

11. The memory device according to claim 9, wherein said address includes:

an upper address, and a lower address, and said address providing unit includes:

an upper address register storing said upper address, a lower address register storing an initial lower address, said lower address register fixing said lower initial address to a predetermined lower initial address when said test mode signal is activated, and said address register receives an external initial lower address through said I/O buffer to set said initial lower address to be said external initial lower address, and a counter providing said lower address, said counter initializes said lower address to said initial lower address value before said access and said counter increasing said lower address from said initial lower address in response to an address increment clock signal.

12. The memory device according to claim 11, wherein said first address register receives an external upper address whenever said test mode signal is activated or not.

13. The memory device according to claim 11, wherein said first address register fixes said upper address to a predetermined upper address when said test mode is activated, and said first address register receives an external upper address through said I/O buffer to initialize said upper address to said external upper address when said test mode is not activated.

14. A method of operating a memory device comprising:

providing a test mode signal;

providing a command which controls an access to a memory cell, wherein said providing said command includes:

setting said command to be a predetermined internal command when said test mode signal is activated, and setting said command to be an external command received from an external circuit when said test mode signal is not activated;

providing an address in response to said command; and allowing said memory cell array to be accessed in response to said address.

15. A method of operating a memory device comprising:

providing a test mode signal;

providing an address for an access to a memory cell array;

allowing said memory cell array to be accessed in response to said address, wherein said providing said address includes:

initializing said address to a predetermined initial address before said access when said test mode signal is activated;

initializing said address to an external initial address received from an external circuit before said access when said test mode signal is not activated;

increasing said address during said access.

* * * * *